United States Patent
Gradinger et al.

(10) Patent No.: US 8,913,386 B2
(45) Date of Patent: Dec. 16, 2014

(54) COOLING MODULE FOR COOLING ELECTRONIC COMPONENTS

(75) Inventors: Thomas Gradinger, Rohr (CH); Berk Yesin, Zürich (CH); Francesco Agostini, Zofingen (CH)

(73) Assignee: ABB Research Ltd., Zürich (CH)

( * ) Notice: Subject to any disclaimer, the term of this patent is extended or adjusted under 35 U.S.C. 154(b) by 279 days.

(21) Appl. No.: 13/432,595

(22) Filed: Mar. 28, 2012

(65) Prior Publication Data

US 2013/0077245 A1      Mar. 28, 2013

Related U.S. Application Data

(63) Continuation of application No. PCT/EP2010/057029, filed on May 21, 2010.

(30) Foreign Application Priority Data

Sep. 28, 2009  (EP) .................................. 09171455

(51) Int. Cl.
| | |
|---|---|
| H05K 7/20 | (2006.01) |
| F28D 15/02 | (2006.01) |
| F28D 1/03 | (2006.01) |
| F28F 3/14 | (2006.01) |
| H01L 23/427 | (2006.01) |
| F28F 1/00 | (2006.01) |

(52) U.S. Cl.
CPC ........ *H05K 7/20936* (2013.01); *F28D 15/0266* (2013.01); *F28D 1/035* (2013.01); *F28F 3/14* (2013.01); *H01L 23/427* (2013.01); *F28F 1/00* (2013.01)
USPC ........... 361/700; 361/699; 361/701; 165/80.4

(58) Field of Classification Search
None
See application file for complete search history.

(56) References Cited

U.S. PATENT DOCUMENTS 5,954,127 A *   9/1999   Chrysler et al. ............... 165/170
6,536,510 B2 *  3/2003   Khrustalev et al. ...... 165/104.33
(Continued)

FOREIGN PATENT DOCUMENTS

DE    100 07 066 A1    8/2001
EP    1 424 532 A1     6/2004
(Continued)

OTHER PUBLICATIONS

International Search Report (PCT/ISA/210) issued on Apr. 14, 2011, by European Patent Office as the International Searching Authority for International Application No. PCT/EP2010/057029.

(Continued)

*Primary Examiner* — Boris Chervinsky
(74) *Attorney, Agent, or Firm* — Buchanan Ingersoll & Rooney PC

(57) ABSTRACT

A cooling module including a condenser, a power module including the cooling module and a method for cooling electric and/or electronic components are provided. The condenser of the cooling module includes at least one panel for cooling electric and/or electronic components. Two sheets of the panel are attached to one another by a process involving roll-bonding such that a conduit is formed between the two sheets. The conduit extends in a direction of a plane formed by the sheets. Cooling may be provided by evaporating coolant in the conduit at an evaporation section of the panel and by condensing the coolant at a condensing section of the panel. A heat load may be transferred from a heat source to a heat receiving unit. The heat receiving unit is adapted to transfer the heat load to the panel which transfers the heat load to an ambient environment by a thermal carrier.

23 Claims, 13 Drawing Sheets

(56) References Cited

U.S. PATENT DOCUMENTS

| | | | |
|---|---|---|---|
| 6,972,365 B2 * | 12/2005 | Garner | 174/16.3 |
| 7,218,519 B2 * | 5/2007 | Prasher et al. | 361/700 |
| 7,219,714 B1 * | 5/2007 | Heydari | 165/80.4 |
| 7,457,118 B1 * | 11/2008 | French et al. | 361/700 |
| 7,551,440 B2 * | 6/2009 | Belady et al. | 361/699 |
| 8,345,425 B2 * | 1/2013 | Toyoda et al. | 361/700 |
| 2002/0135980 A1 * | 9/2002 | Vafai | 361/700 |
| 2006/0144567 A1 | 7/2006 | Zhu et al. | |
| 2007/0277962 A1 | 12/2007 | Jylhakallio | |
| 2009/0218085 A1 * | 9/2009 | Rogers et al. | 165/180 |

FOREIGN PATENT DOCUMENTS

| | | | |
|---|---|---|---|
| EP | 2 031 332 A1 | 3/2009 | |
| JP | 6-85480 A | 3/1994 | |
| JP | 7-183437 A | 7/1995 | |

OTHER PUBLICATIONS

International Preliminary Report on Patentability (PCT/IB/373) issued on Apr. 3, 2012, by European Patent Office as the International Searching Authority for International Application No. PCT/EP2010/057029.

Written Opinion (PCT/ISA/237) issued on Apr. 14, 2011, by European Patent Office as the International Searching Authority for International Application No. PCT/EP2010/057029.

* cited by examiner

US 8,913,386 B2

COOLING MODULE FOR COOLING ELECTRONIC COMPONENTS

RELATED APPLICATIONS

This application claims priority as a continuation application under 35 U.S.C. §120 to PCT/EP2010/057029, which was filed as an International Application on May 21, 2010 designating the U.S., and which claims priority to European Application 09171455.0 filed in Europe on Sep. 28, 2009. The entire contents of these applications are hereby incorporated by reference in their entireties.

FIELD

The disclosure relates to the cooling of electronic and electric components. More particularly, the present disclosure relates to a cooling module including a condenser, a power module including the cooling module, and a method of cooling electric and/or electronic components.

BACKGROUND INFORMATION

Cooling systems are widely used in the field of electric, electronic, low, medium and high voltage applications.

Power electronic devices must be cooled in operation, in order to avoid excessive temperatures and consequently failure of the devices. Typical applications feature not only high rates of heat generation by the devices, but also high power densities, for example, heat fluxes.

Water-cooled systems can generally deal well with high power density. However, such systems may be costly and may need an active, moving part in the form of a pump, which has a finite life and must be serviced. Also, water cooling systems are usually quite expensive.

Known air cooling systems, consisting of an array of fins extending from a base plate, may need no pump, but may need a fan in forced convection. However, as the heat transfer coefficient between fin surface and air is low, a large fin area is required for sufficient cooling performance. Further, if excessive air velocity, pressure drop, and noise level are to be avoided, a sufficient cross-section of the airflow must be provided. Such designs may result in bulky heat sinks with long, thick, and consequently heavy fins for acceptable fin efficiency. This drawback may be even made worse if one asks for a minimum spacing between adjacent fins in order to avoid clogging of the inter-fin channels in dirty air environment as may occur in major applications. A two phase cooler is described in EP 2 031 332 A1 showing a passive system based on the loop-thermosyphon principle.

SUMMARY

An exemplary embodiment of the present disclosure provides a cooling module for cooling at least one electronic and/or electric component. The exemplary cooling module includes a condenser. The condenser includes a panel having two sheets that are attached to one another by a process involving roll-bonding such that a conduit is formed between the two sheets extending in a direction of a plane formed by the sheets.

An exemplary embodiment of the present disclosure provides a power module which includes a heat receiving unit, and at least one electric and/or electronic component thermally connected to the heat receiving unit. The exemplary power module also includes the above-described cooling module with a coolant for receiving heat from the heat receiving unit and for transferring the heat to an ambient environment by a thermal carrier in an operating state of the cooling module.

An exemplary embodiment of the present disclosure provides a method of cooling electric and/or electronic components. The exemplary method includes receiving heat from at least one electric and/or electronic component thermally connected to a heat receiving unit of a cooling module by the heat receiving unit in an operating state of the cooling module. The exemplary method also includes transferring heat in an operating state of the cooling module from the heat receiving unit to a condenser of the cooling module including a panel having two sheets that are attached to one another by a process involving roll-bonding such that a conduit is formed between the two sheets extending in a direction of a plane formed by the sheets.

BRIEF DESCRIPTION OF THE DRAWINGS

Additional refinements, advantages and features of the present disclosure are described in more detail below with reference to exemplary embodiments illustrated in the drawings.

The reference signs used in the drawings, and their meanings, are listed in summary form as a list of reference signs. In principle, identical parts or functionally similar parts are provided with the same reference symbols in the drawings.

DETAILED DESCRIPTION

Figure 1:
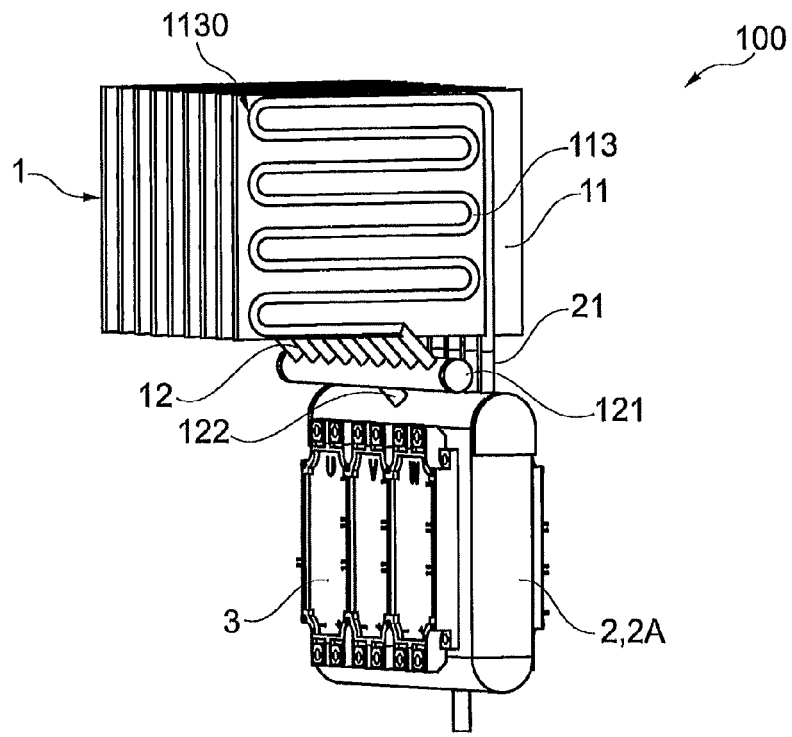
FIG. 1 schematically shows a perspective view of a cooling module with a condenser and an evaporator according to an exemplary embodiment of the present disclosure.

Exemplary embodiments of the present disclosure provide an improved, efficient and flexible cooling for electronic and electric components.

Exemplary embodiments of the present disclosure provide a cooling module, a power module including the cooling module, and a method of cooling electric and/or electronic components. Additional exemplary embodiments are illustrated in the drawings.

According to an exemplary embodiment of the present disclosure, a cooling module is provided for cooling at least one electronic and/or electronic component. The cooling module includes a condenser which has at least one panel with two sheets that are attached to one another by a process involving rollbonding such that a conduit is formed between the two sheets extending in a direction of a plane formed by the sheets.

Such a cooling module may have a better performance than a known air cooling or water cooling system and may avoid clogging in a dirty air environment.

Another possible advantage of the cooling module is that it may provide for a high cooling performance and may be capable of dealing with high power densities, for example, high heat flux.

A cooling module as described above may have no need for an active pump and may provide wide cooling air passages to reduce the risk of clogging in a dirty air environment. A sufficient flow cross-sectional area and fin surface area may be provided by the cooling module to allow for moderate air velocity, pressure drop and noise, the cooling module possibly being enabled by lightweight and still highly efficient fins.

With such a cooling module, power electronic components such as integrated gate bipolar transistor (IGBT) modules used in motor converters, and auxiliary converters of metros, may be efficiently cooled. The cooled IGBT modules may be, for example, 1500 A/3300 V ABB HiPak modules.

The above described cooling module may provide for sufficient cooling performance for electronic components, such as metro converters to keep the temperature and the temperature fluctuation of the electronic devices (for example, an IGBT and diode junction temperature) low enough under the transient loads of metro operation, to ensure sufficient lifetime of the electronic components. Metro converters cooled by the above-mentioned cooling module may be mounted under a metro car body, wherein the height may be limited to about 560-600 mm, for example. The cooling module may use the height in an optimal way such that a minimal space is used for the cooling module.

The cooling module as described above for cooling a metro converter, for example, may enable to have the modules of the metro converter arranged closely together, e.g. 6-12 IGBT modules, arranged in a plane as a 2×3, 2×4, 2×5, or 2×6 matrix such that large gaps between adjacent modules may be avoided. Thus, unnecessarily long electronical connections (e.g., bus bars) may be avoided. Hence, next to coping with high power (high losses) the cooling module may also cope with high power density.

A further advantage of the cooling module may be that its acoustic noise levels are low being suitable for a metro converter, for example, if the metro is waiting in a station which imposes limits on the cooling air velocity and the use of powerful cooling fans to keep the noise level low.

The cooling module as described above may be cleanable from outside, for example, with a water hose, and may not clog or loose its performance under conditions of dirty air, as is typical in metro applications.

Furthermore, the cooling module may be weight and space optimized, cost competitive, and may be modular, for example, the cooling module may be made up for 2×1 IGBT modules. By arranging n identical cooling modules next to each other, it is, for example, possible to obtain a cooler for 2×n IGBT modules. The above-mentioned cooling module may have a weight that is not exceeding 25 kg providing for an easy handling during manufacturing.

According to an exemplary embodiment of the present disclosure, the condenser may include more than one panel, e.g. at least two panels.

The roll-bonded sheets may be attached to one another such that at least a conduit is provided between the two sheets.

One or a plurality of conduits may be provided per panel according to an exemplary embodiment of the present disclosure.

According to an exemplary embodiment of the present disclosure, the conduit may include a plurality of loops.

According to an exemplary embodiment of the present disclosure, the conduit may have a loop-shaped form.

According to an exemplary embodiment of the present disclosure, the conduit may be open, and not a closed loop.

According to an exemplary embodiment of the present disclosure, the conduit may be closed.

According to an exemplary embodiment of the present disclosure, the cooling module may be a thermosyphon cooling module.

According to an exemplary embodiment of the present disclosure, the cooling module may be a loop thermosyphon cooling module.

According to an exemplary embodiment of the present disclosure, the cooling module may be a two-phase cooling module.

According to an exemplary embodiment of the present disclosure, the panel may be configured to form a fin or a condenser panel.

According to an exemplary embodiment of the present disclosure, the cooling module may be a cooling module for electronic components, for example, power electronic components (e.g. IGBTs).

According to an exemplary embodiment of the present disclosure, the condenser may be installed at some distance from the evaporator, meaning that the condenser may be at a certain distance from where the heat is collected by means of evaporation, for example, on top of a cabinet.

According to an exemplary embodiment of the present disclosure, the conduit includes at least one loop.

According to an exemplary embodiment of the present disclosure, the cooling module may include a heat receiving unit that is connected to the conduit. The heat receiving unit has a connection means for connecting at least one heat source such that a heat load is thermally transferable to the heat receiving unit. The heat receiving unit may be fluidly connected to the conduit.

According to an exemplary embodiment of the present disclosure, the cooling module may include more than one heat receiving unit.

According to an exemplary embodiment of the present disclosure, the panel includes the heat receiving unit.

According to an exemplary embodiment of the present disclosure, the condenser panel may be mechanically and thermally connected to the base plate. For example, the base plate may have a groove that receives the condenser panel or an end of the condenser panel.

According to an exemplary embodiment of the present disclosure, the heat receiving unit is configured to receive heat from more than one heat source.

According to an exemplary embodiment of the present disclosure, the heat receiving unit is configured to receive heat from a heat source such as a low, medium, or high voltage electronic component, for example. The heat source may be a power electronic device. The high voltage electronic component may be arranged at the heat receiving unit.

The high voltage electronic component may be attached to the heat receiving unit according to an exemplary embodiment of the present disclosure.

According to an exemplary embodiment of the present disclosure, the cooling module may include a plurality of panels that are arranged at the heat receiving unit such that a panel stack is formed, wherein the heat receiving unit is connected to at least one conduit of each panel. The heat receiving unit may be fluidly connected to at least one conduit of each panel.

According to an exemplary embodiment of the present disclosure, the plurality of panels may be arranged at the heat receiving unit or at a certain distance from the element to be cooled, for example, such that the panel stack including the plurality of panels may be installed on top of a cabinet, wherein the heat receiving unit, for example, an evaporator, is arranged inside the cabinet.

According to an exemplary embodiment of the present disclosure, the plurality of panels may be arranged modularly at the heat receiving unit, such that each panel may be exchangeable.

According to an exemplary embodiment of the present disclosure, at least one part of the panels may be bended to enlarge the width of the panel stack of panel array compared to the base plate.

According to an exemplary embodiment of the present disclosure, the top or the top and bottom of the panel array may be covered by cover panels or cover condenser panels. Thus, small sides of the inter-panel air channels may be made thermally active, thus possibly gaining some thermal performance.

According to an exemplary embodiment of the present disclosure, the heat receiving unit may be a thermally conductive base plate.

According to an exemplary embodiment of the present disclosure, the base plate may be an aluminum plate or a double aluminum plate, and may be braced to the roll-bonded unit.

According to an exemplary embodiment of the present disclosure, each condenser may be arranged next to another condenser forming a condenser stack, wherein the condensers may be attached to one another by brazing each base plate of each condenser to one another.

According to an exemplary embodiment of the present disclosure, the heat receiving unit may be an evaporator.

According to an exemplary embodiment of the present disclosure, the cooling module may also include a coolant being present in the conduit for transferring heat, wherein the heat is transferred by evaporating a first portion of the coolant and by condensing a second portion of the coolant.

According to an exemplary embodiment of the present disclosure, a first percentage of the coolant is liquid and a second percentage of the coolant is gaseous. Thus, the coolant may be in a saturated condition filling the conduit.

The ratio of liquid to gaseous of the coolant may depend on the coolant type, the temperature, the pressure of the coolant, the thermal load (the heat that must be dissipated), and/or the diameter as well as the geometry of the conduit containing the coolant.

According to an exemplary embodiment of the present disclosure, the conduit (e.g. an internal channel) may have one of a rectangular, a polygonal, a triangular, a trapezoid, a circular, and an oval cross-section geometry for non-pulsating panels.

The spacing between the roll-bond panels may range between a few millimeters, for example, in forced convection, up to 10 mm or more for natural convection applications or for anti-clogging purposes.

The conduit thus may have any geometry being adapted for a coolant motion provided by gravity cooling according to an exemplary embodiment of the present disclosure. Such a conduit may have a plurality of loops and may be a closed conduit, wherein the coolant is heated by a transferred heat load of the heat source and evaporated at an evaporator section of the conduit. The evaporated coolant moves to a condenser section of the conduit due to gravity. At the condenser section, the gaseous coolant is condensed to liquid transferring heat to a thermal carrier such as air. Due to gravity, the liquid coolant flows back to the evaporator section, and the above mentioned process starts again.

According to an exemplary embodiment of the present disclosure, the conduit has a geometry providing pulsating cooling, which does not work according to the gravity principle, and therefore the cooler may be arranged arbitrarily with respect to the direction of gravitational acceleration. The pulsating conduit may have capillary dimensions wound in a serpentine manner and joined end to end. The conduit may be first evacuated and then filled partially with a working fluid, which may distribute itself naturally in the form of liquid-vapor plugs and slugs inside the capillary pulsating conduit. One end of the conduit may receive heat (e.g., evaporator section) and may transfer it to the other end (e.g., condenser section) by a pulsating action of the liquid-vapour system. There may exist an optional adiabatic zone in between. Thus, the cooling module with a pulsating conduit may essentially be a non-equilibrium heat transfer device whose performance success may depend primarily on the continuous maintenance of these non-equilibrium conditions within the system. The liquid-vapour slug transport may be due to thermally driven pressure pulsations in the respective conduits. During operation, a temperature gradient may prevail between the evaporator and the condenser section, causing non-equilibrium pressure conditions. The heat transfer to the evaporating section may cause the bubbles in the evaporator section to grow continuously, pushing liquid toward the low-temperature end (e.g., condenser section) due to a higher pressure/temperature. Simultaneously, the condensation at the other end will further enhance the pressure difference between the two ends. Thus, a non-equilibrium state may be formed between the driving thermal potentials and the system in return may attempt to equalize the internal pressure.

If a plurality of conduit loops are inter-connected with each other, the motion of the liquid slugs and vapour bubbles in one loop may lead to the motion of slugs and bubbles in adjacent loops. The inter-play between driving and restoring forces leads to oscillation of the vapour bubbles and liquid slugs. Further, inherent perturbations present in real systems may augment pressure fluctuations in the system.

Unlike in known heat pipes, for example, with gravity conduit(s), no steady-state pressure equilibrium may be achieved for an operating pulsating cooling. The frequency and amplitude of the oscillations may depend on the heat flow rate and the mass fraction of the liquid in the pulsating conduit. Through these oscillations, heat which is supplied by a heat source at the evaporator section may be carried to the condenser section and may be removed by a thermal carrier such as air.

According to an exemplary embodiment of the present disclosure, at least one conduit is formed such that the coolant motion is provided by gravity or pulsating cooling in an operating state of the cooling module.

According to an exemplary embodiment of the present disclosure, the density of the evaporated vapour of the coolant may be smaller than the condensed coolant.

According to an exemplary embodiment of the present disclosure, the diameter of the conduit for pulsating cooling may be below 2 mm. Generally, the diameter of the conduit for pulsating cooling may have any dimension that is enabling pulsating cooling, pulsating heat pipe cooling or pulsating thermosyphon cooling motion.

According to an exemplary embodiment of the present disclosure, the conduit for pulsating cooling may be open and not a closed loop conduit.

According to an exemplary embodiment of the present disclosure, the conduit for pulsating cooling may be closed.

According to an exemplary embodiment of the present disclosure, the conduit for pulsating cooling may include several loops.

Such a cooling module with a conduit providing a coolant motion by pulsating cooling may not depend on gravity and therefore may be arranged in any form independently from gravity.

The pulsating flow of the two-phase coolant may occur in the conduit, for example, in the form of a slug flow, leading to a very efficiency heat transfer.

The pulsating flow may be stimulated by a geometry, wherein the conduit may have a form of a meandering conduit and may be in contact with a heat receiving unit at 180° bendings of the conduit, for example, wherein the meandering conduit may be either closed or open.

According to an exemplary embodiment of the present disclosure, the bendings may be at least partial rectangular bendings, maximizing the contact area with the base plate for providing a small thermal resistance to the base plate and a good mechanical stability of the fin in the base plate groove.

According to an exemplary embodiment of the present disclosure, the heat is transferable from the condenser to the ambient by a thermal carrier in an operating state of the cooling module.

According to an exemplary embodiment of the present disclosure, the thermal carrier may be cooling air.

According to an exemplary embodiment of the present disclosure, the thermal carrier may be water.

According to an exemplary embodiment of the present disclosure, a power module is provided to include at least one electric and/or electronic component thermally connected to a heat receiving unit, and a cooling module of any of the preceding exemplary embodiments of the present disclosure with a coolant for receiving heat from the heat receiving units and for transferring the heat to the ambient by a thermal carrier in an operating state of the cooling module.

According to an exemplary embodiment of the present disclosure, the use of a cooling module of any of the above-described exemplary embodiments for cooling at least one electric and/or electronic component is provided.

According to an exemplary embodiment of the present disclosure, the electronic components may be power electronic components, for example, IGBTs.

According to an exemplary embodiment of the present disclosure, a method of cooling electric and/or electronic components is provided. The method includes the steps of receiving heat from at least one electric and/or electronic component thermally connected to a heat receiving unit of a cooling module by the heat receiving unit in an operating state of the cooling module, and transferring heat from the heat receiving unit to a condenser of the cooling module. The cooling module includes a panel having two sheets that are attached to one another by a process involving rollbonding such that a conduit is formed between two sheets extending in a direction of a plane formed by the sheet in an operating state of the cooling module.

According to an exemplary embodiment of the present disclosure, the method may include the step of transferring the heat from the condenser to an ambient by evaporating a first portion of a coolant in the conduit, by condensing a second portion of the coolant in the conduit, and by transferring the heat from the conduit to a thermal carrier. The at least one conduit is formed such that cooling motion is provided by gravity in an operating state of the cooling module.

According to an exemplary embodiment of the present disclosure, the method may include the step of transferring the heat from the condenser to the ambient by evaporating a first portion of a coolant in the conduit, by condensing a second portion of the coolant in the conduit, and by transferring the heat from the conduit to a thermal carrier, wherein at least one conduit is formed such that the cooling motion is provided by pulsating cooling in an operating state of the cooling module.

These and other aspects of the present disclosure will become apparent from and elucidated with reference to the exemplary embodiments described hereinafter.

FIG. 1 schematically depicts a cooling module 100 which includes a condenser 1. The condenser 1 includes a panel 11 having two sheets that are attached to one another by a process involving roll-bonding, such that a conduit 113 is formed between the two sheets extending in a direction of a plane formed by the sheets. The conduit 113 includes a plurality of the loops 1130. The condenser 1 includes a plurality of panels 11 with conduits 113, where each conduit 113 leads to a condensate conduit 12 which leads from the individual panels 11 or fins 11 to a condensate header 121. One condensate pipe 122 leads from the condensate header 122 to a heat receiving unit 2, 2A in the form of an evaporator 2A. The evaporator 2A is fluidly connected to the conduit 113 by vapour conduits 21, each leading to the conduit 113 of one fin 11 or panel 11.

The heat receiving unit 2, 2A in the form of an evaporator 2A has a connecting means for connecting at least one heat source 3 to the evaporator 2A such that a heat load of the heat source 3 is thermally transferable to the heat receiving unit 2, 2A. The heat source 3 may be a metro converter, for example, a semiconductor switch, or any other electric and/or electronic component such as a power electronic component or IGBTs being thermally connected to the heat receiving unit 2, 2A.

The exemplary embodiment described in FIG. 1 as well as all additional exemplary embodiments of the drawings described below are adapted to solve the problem of limited fin efficiency encountered with conventional air cooled finned heat sinks in the application of metro converter cooling, wherein conduction is the only mechanism of the heat transport within the fins. In known systems, the boundary conditions of high cooling performance, high power density, limited air speed (because of noise restrictions at the metro stations), and sufficiently wide inter-fin channels may lead to long fins. To keep the fin efficiency sufficiently high, these fins must be made rather thick, leading to a heavy and large heat sink. This drawback is solved by the embodiment of FIG. 1 and the embodiments of the additional drawings described below as the heat transfer inside the fins is enhanced by convection.

A loop thermosyphon with a two-phase coolant may be used according to the exemplary embodiments of the drawings such that the cooling motion is driven by gravity alone, without the need of an active pump. The loop thermosyphon may include loop-shaped conduits 113, 1130 containing a coolant operated in a two-phase range. One section of the conduit 113 may act to evaporate the coolant while another section of the conduit may act to condense the coolant. The coolant motion may be driven by gravity, as the density of the coolant vapour is much smaller than that of the liquid. In a cooling system according to exemplary embodiments of the present disclosure, the evaporating section of a thermosyphon conduit receives heat from an electronic device 3 while the condenser section of the thermosyphon conduit transfers heat to cooling air or some other suitable cooling agent.

Cost-efficient cooling solutions may include roll-bonded panels, and/or solar thermal absorbers. The rollbonded panels may be well-suited as fins for the cooling of electric or electronic components 3 as they are cheap, thin, lightweight, and as there is a great flexibility concerning the exact pattern of the channels 113 or conduits 113 in the panel 11. The rollbonded panels 11 may be regarded as highly efficient fins 11.

In roll-bonding, two sheets of metal may be pressed together with high pressure by rolling. Thereby, certain areas of the sheets may be omitted, by treating them with a separating agent, such as graphitepowder, for example, such that the sheets can not join in these areas. After bonding, the sheets are inflated to create fin channels or conduits in the areas treated with a separating agent.

Such roll-bonded panels 11 may be used as condensers 1 of the loop thermosyphon or cooling module 100. To complete the loop thermosyphon 100, a separate evaporator 2A may be added to which the power electronic devices 3 are attached. As described in the following, a separate evaporator 2A may also be omitted, wherein a section of the channels 113 or the conduits 113 in the fins 11 may constitute the evaporator 2A. All fins 11 may be directly attached to a base plate 2B, to which the electronic devices 3 may be attached (see, for example, FIG. 11).

One particular advantage of using rollbonded panels 11 as fins 11 may be that the surface of the panel 11 is not even, but contains elevations from the channels or conduits 113 inside the panel 11. These elevations have the effect of disturbing the air flow, enhancing the turbulence intensity and thus enhancing the heat transfer between panel surface and air.

Figures 2, 3:
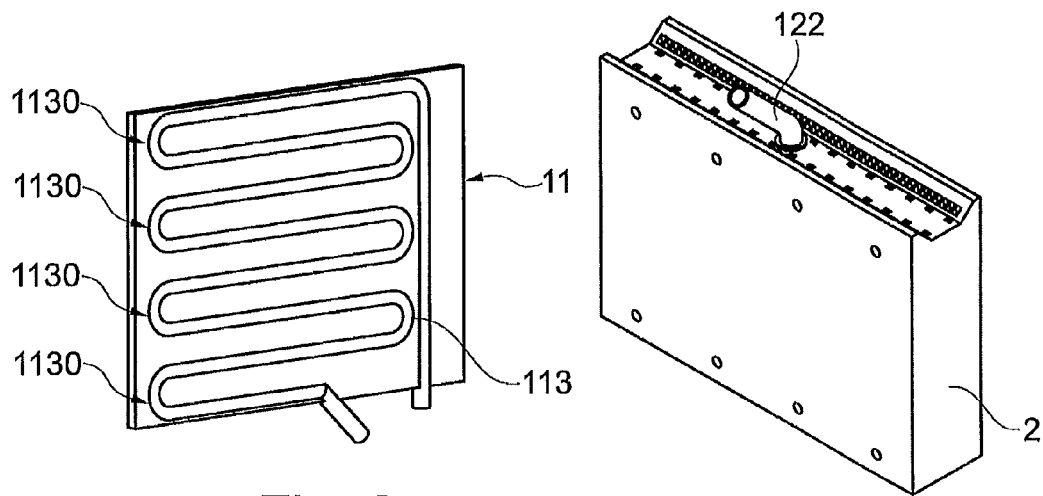
FIG. 2 schematically shows a perspective view of a panel of the condenser of FIG. 1.
FIG. 3 schematically shows a perspective view of the evaporator of FIG. 1.

FIG. 2 schematically shows an individual panel 11 or fin 11 of FIG. 1 with a conduit 113 with several loops 1130 such that the conduit 113 has a loop-shape form.

FIG. 3 schematically shows a perspective view of the heat receiving unit 2, 2A of FIG. 1 in the form of the evaporator 2A with a condensate pipe 122.

Figure 4:
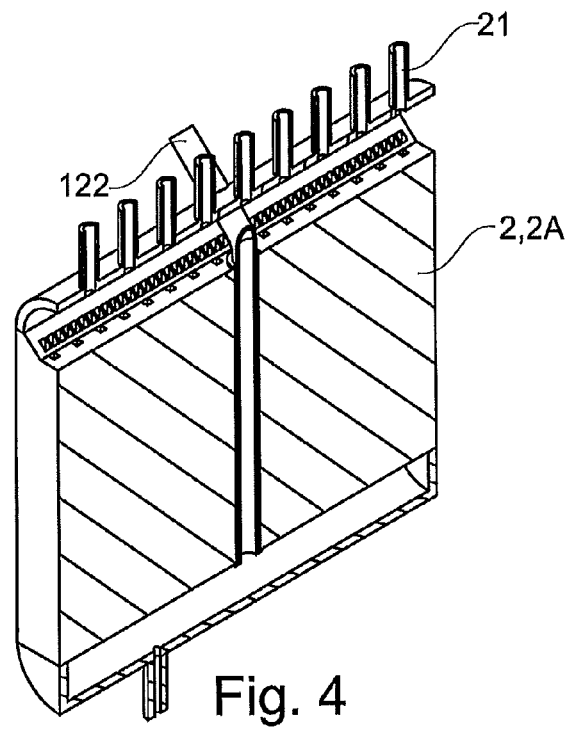
FIG. 4 schematically shows a perspective view of a cross-section of the evaporator of FIG. 1.

FIG. 4 schematically shows a perspective view of a cross-section of the heat receiving unit 2, 2A in the form of an evaporator 2A of FIG. 1 with the condensate pipe 122 for receiving the condensate from the condenser as well as a plurality of vapour conduits 21 leading to the conduits of the condenser for receiving the evaporated coolant from the evaporator 2A.

Figure 5:
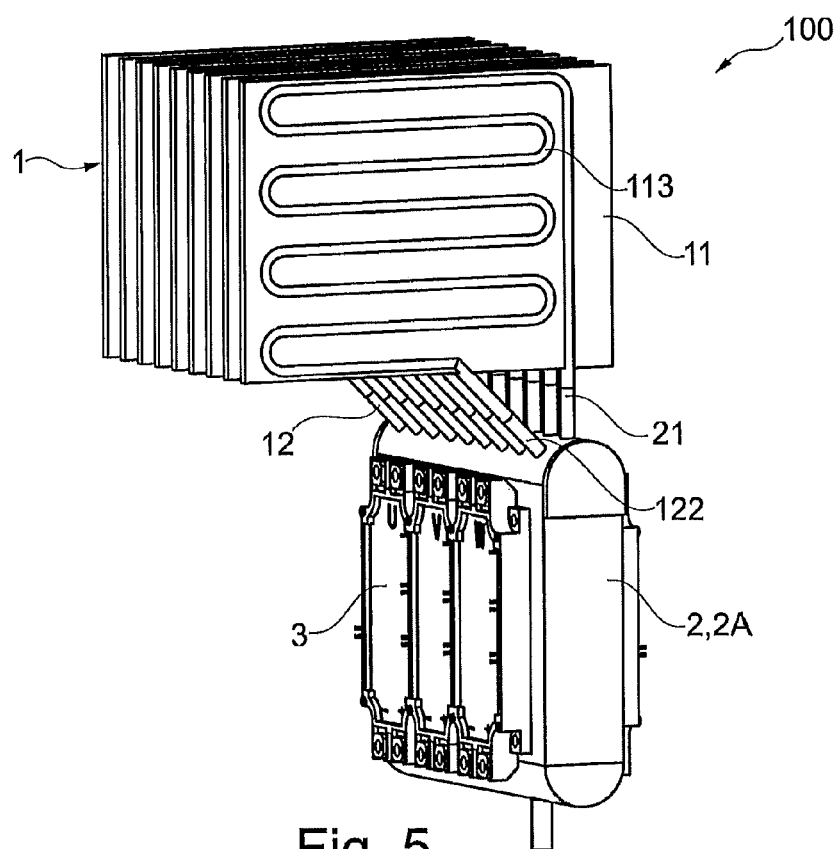
FIG. 5 schematically shows a perspective view of a cooling module with a condenser and an evaporator according to an exemplary embodiment of the present disclosure.

FIG. 5 schematically shows a perspective view of the cooling module 100 of FIG. 1 with the difference, that there is no condensate header and not only one condensate pipe 122 but a plurality of condensate pipes 122, each leading from the conduit 113 of each of the panels 11 of the condenser 1 via condensate conduits 12 directly to the evaporator 2A.

Figure 6:
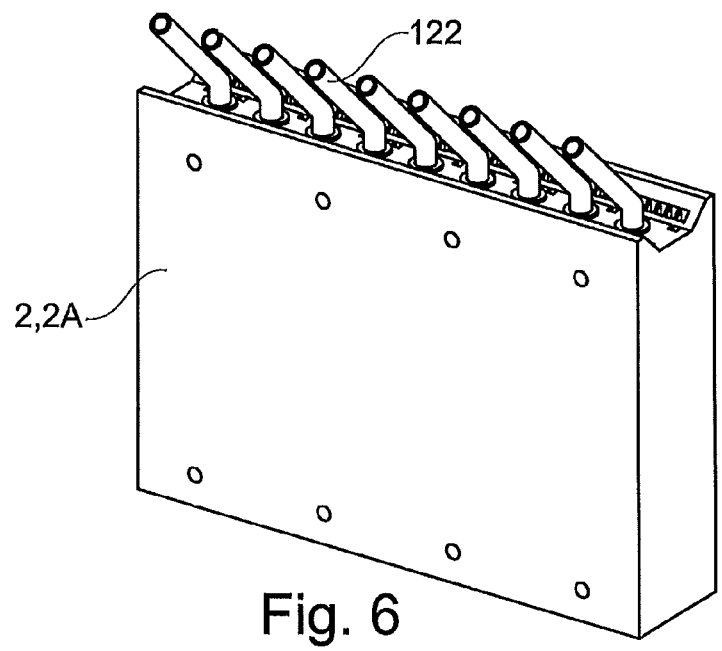
FIG. 6 schematically shows a perspective view of the evaporator of FIG. 5.

FIG. 6 schematically shows a perspective view of the heat receiving unit 2 in the form of an evaporator 2A with the condensate pipes 122 according to FIG. 5.

Figure 7:
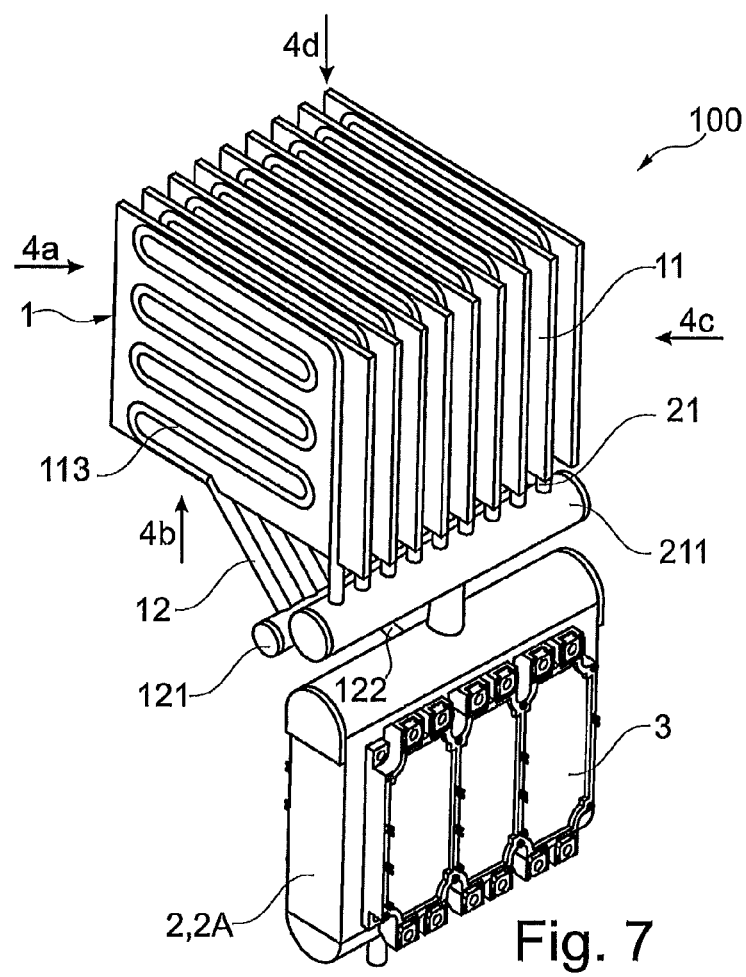
FIG. 7 schematically shows a perspective view of a cooling module with a condenser and an evaporator according to an exemplary embodiment of the present disclosure.

FIG. 7 schematically shows a perspective view of the cooling module 100 of FIG. 1, with the difference, that the cooling module 100 further comprises a vapour header 211 or vapour collector 211 receiving a vaporous coolant from the heat receiving unit 2 in the form of an evaporator 2A and transferring the evaporated coolant via a plurality of vapour conduits 21 to the conduits 113 of the panels 11 of the condenser 1 of the cooling module 100.

Cooling air 4 may flow from different directions through the conduits 113 or channels 113 of the fins 11 or panels 11 as indicated by the arrows 4a, 4b, 4c and 4d.

Electronic devices 3 may be attached either at both sides of the evaporator 2A as shown in FIG. 7 or only on one side.

The airflow through the fins 11 may be due to forced convection using a fan or blower, or due to natural convection. When used on a train, or more generally on any vehicle, the fins 11 may be oriented to make use of the driving wind. The axes of the inter-fin channels 113 or conduits 113 may be orientated in driving direction.

Figure 8:
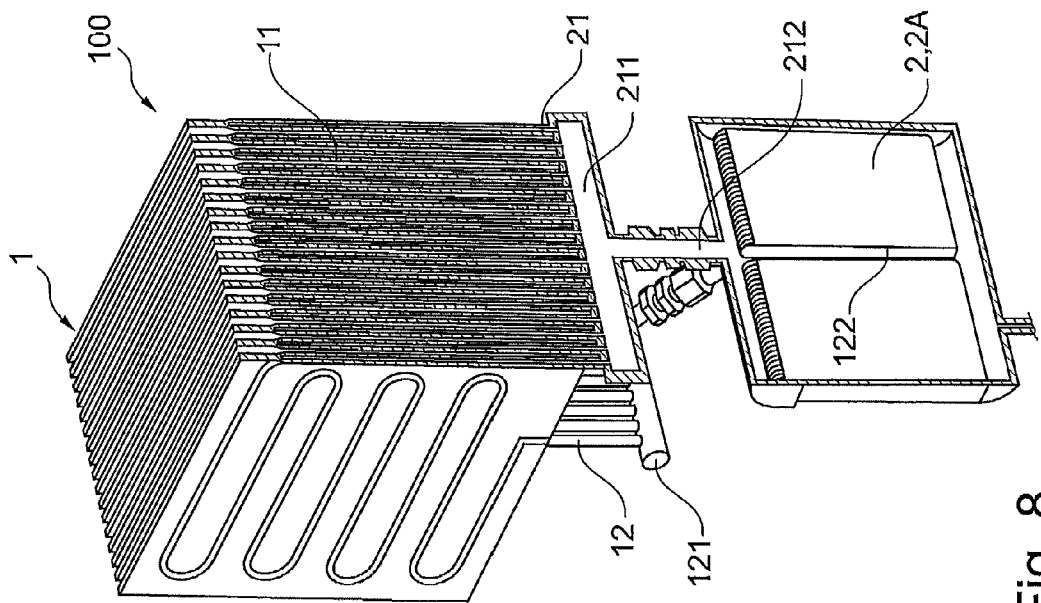
FIG. 8 schematically shows a perspective view of a cross-section of a cooling module with a condenser and an evaporator according to an exemplary embodiment of the present disclosure.

FIG. 8 schematically shows a perspective view of a cross-section of a cooling module 100 with a condenser 1 having a plurality of panels 11 having two sheets that are attached to one another by a process involving roll-bonding, such that a conduit 113 is formed between the two sheets extending in a direction of a plane formed by the sheets, where each conduit leads to a condensate conduit 12 being connected to a condensate header 121. A condensate pipe 122 connects the condensate header 121 with a heat receiving unit 2, 2A in the form of an evaporator 2A. A vapour pipe 212 leads a vaporous coolant of the evaporator 2A to a vapour header 211 or vapour collector 211.

Figure 9:
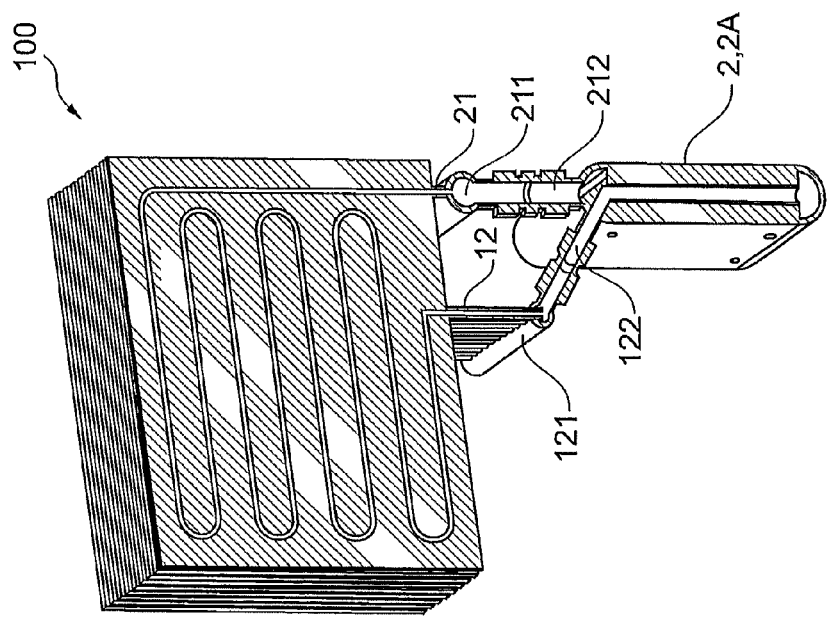
FIG. 9 schematically shows a perspective view of another cross-section of the cooling module of FIG. 8.

FIG. 9 schematically shows a cross-sectional view of the cooling module 100 of FIG. 8.

Figure 10:
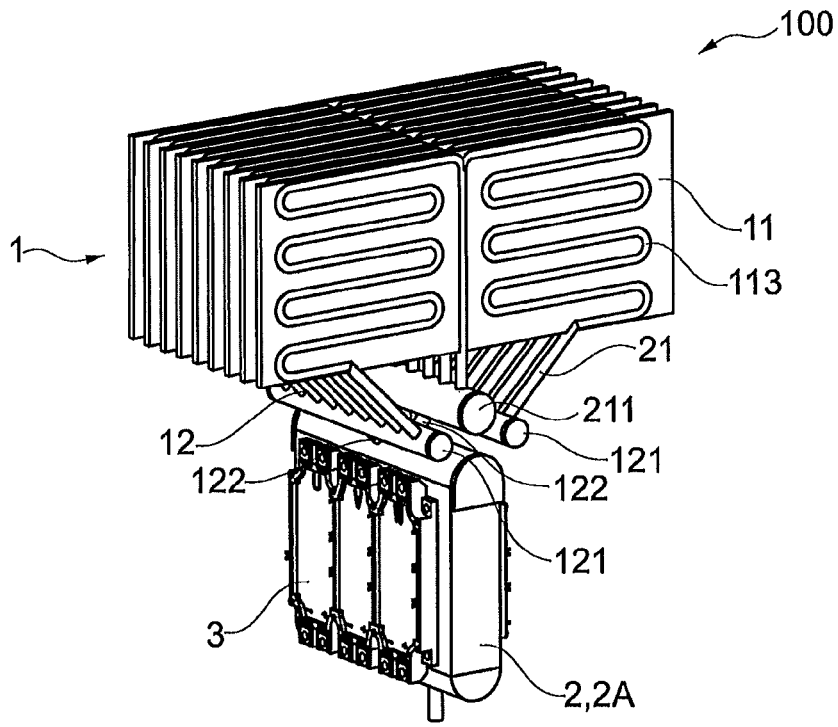
FIG. 10 schematically shows a perspective view of a cooling module with a condenser with symmetrically arranged panels and an evaporator according to an exemplary embodiment of the present disclosure.

FIG. 10 schematically shows the cooling module 100 of FIG. 1 with the difference that the condenser 1 includes a plurality of panels 11 arranged in a symmetric way. The vapour of a coolant is transferred from the evaporator 2A to a vapour header 211 or vapour collector 211 and from there via a plurality of pipes to each conduit 113 to each of the symmetrically arranged panels 11 of the condensers 1.

Figure 11:
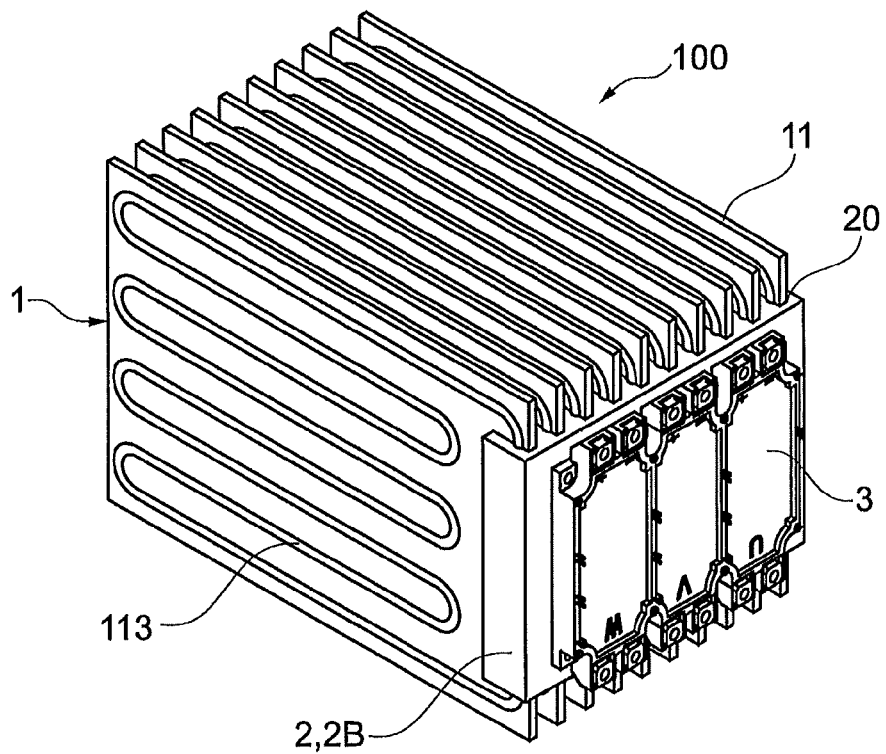
FIG. 11 schematically shows a perspective view of a condenser with a base plate according to an exemplary embodiment of the present disclosure.

FIG. 11 schematically shows a perspective view of a cooling module 100 including a condenser 1 with a plurality of panels 11 having two sheets being attached to one another by a process involving roll-bonding such that a conduit 113 is formed between two sheets extending in a direction of a plane formed by the sheets. The cooling module 100 further includes a heat receiving unit 2, 2B in the form of a base plate 2B which has a connecting means for connecting at least one heat source 3 such that a heat load is thermally transferable to the heat receiving unit 2, 2B which is connected to the conduit 113 of each panel 11 such that the heat load is transferrable from the heat receiving unit 2, 2B to the conduit 113.

The base plate 2B may be a thermally conductive base plate 2B conducting the heat load to the conduit 113 of each panel 11 of the condenser 1.

The fins 11 or panels 11 may be mechanically and thermally connected to the base plate 2B. According to FIG. 11, this connection is established by using a base plate 2B with grooves 20 that receive the fins 11. To provide an optimal thermal contact, the grooves 20 may be so deep that they completely surround an evaporation section of the conduits 113 or channels 113. The corresponding fins 11 may have a keyhole shape. One way to manufacture a base plate 2B with grooves is by aluminum extrusion. However, keyhole shape grooves 20 might be difficult to extrude because the groove 20 may be narrow at its exit, such that the extrusion tool might break. To improve extrudability, the evaporation section of the channel 113 or conduit 113 may be made wide. The corresponding grooves 20 may have no bottleneck anymore. To ensure a tight contact between fins 11 or panels 11 and base plate 2B, yielding minimum thermal resistance, one way is to insert the fins 11 into the base plate grooves 20 of the base plate 2B prior to inflation, then inflate the fin channels 113 or conduits 113, whereby the channels 113 in the grooves 20 acquire the exact shape of the grooves 20 of the base plate 2B.

Another option of bonding the fins 11 to the base plate 2B is by brazing. This is particularly interesting if the base plate groove 20 receives only a flat sheet end of the roll-bonded panel 11, and not an evaporation channel 113, because in this case, establishing of a tight contact by inflation is not an option.

The base plate 2B may be located on one side of the plurality of fins 11 as shown in FIG. 11, or at the bottom of the plurality of fins 11.

Figure 12:
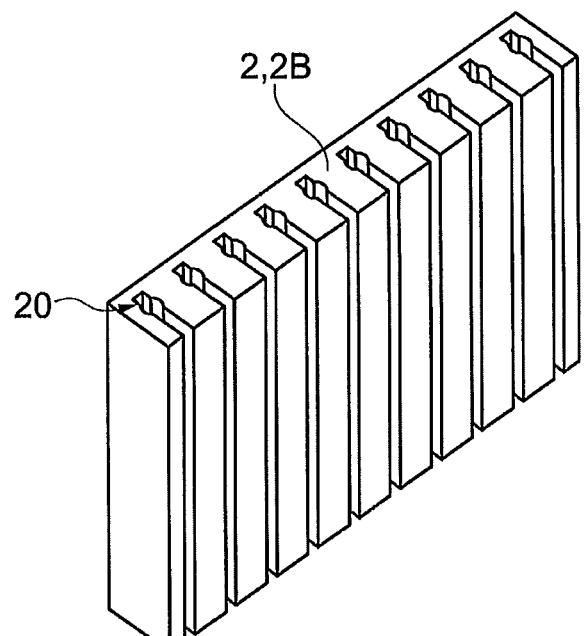
FIG. 12 schematically shows a perspective view of the base plate of FIG. 11 according to an exemplary embodiment of the present disclosure.

FIG. 12 schematically shows a perspective view of the heat receiving unit 2, 2B in the form of a base plate 2B of FIG. 11 including a plurality of grooves 20 that have the shape of a keyhole, for receiving the panels of the condenser.

Figure 13:
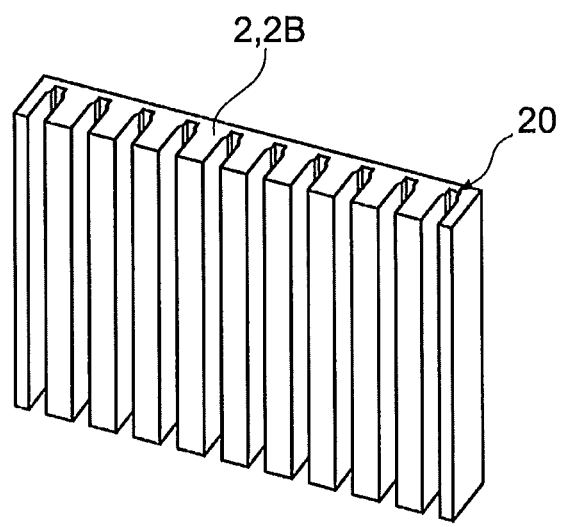
FIG. 13 schematically shows a perspective view of the base plate of FIG. 11 according to an exemplary embodiment of the present disclosure.

FIG. 13 schematically shows a perspective view of the base plate 2B of FIG. 12, with the difference, that the grooves 20 do not have the shape of a keyhole with a bottleneck, but the shape of a bottle without bottleneck.

Figure 14:
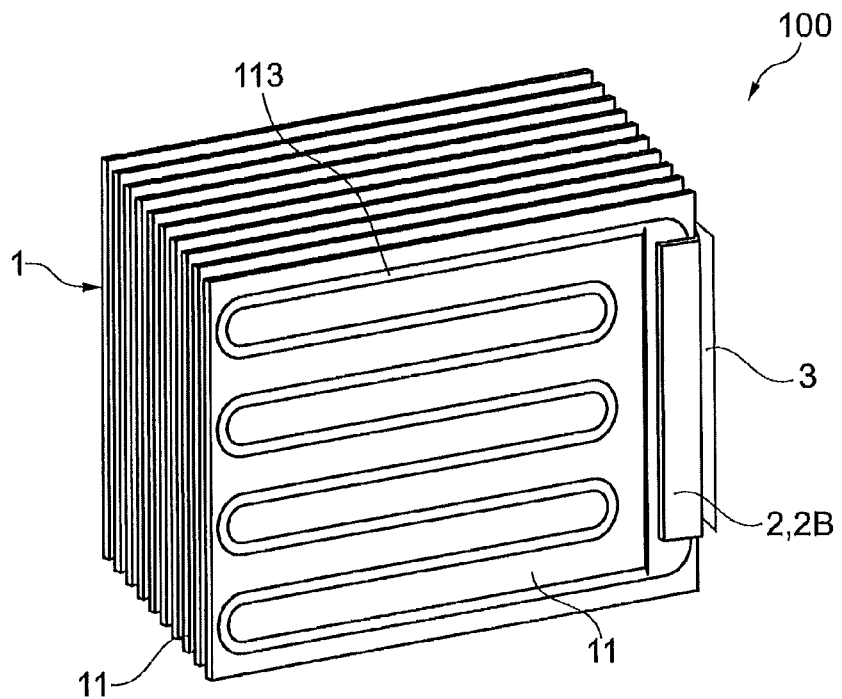
FIG. 14 schematically shows a perspective view of a cooling module with a condenser and a base plate according to an exemplary embodiment of the present disclosure.

FIG. 14 schematically shows a perspective view of a cooling module 100 of FIG. 11 wherein the base plate 2B is partly surrounding an evaporating section of each conduit 113 of the panels 11.

Figure 15:
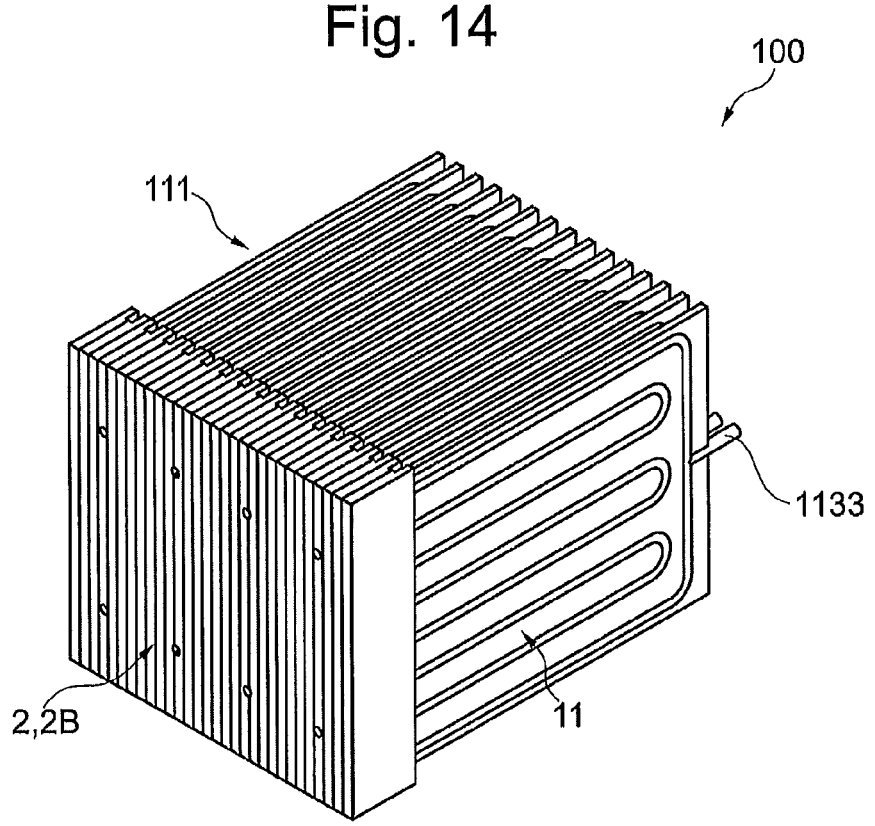
FIG. 15 schematically shows a perspective view of a cooling module with a condenser and a base plate according to an exemplary embodiment of the present disclosure.

FIG. 15 schematically shows a perspective view of a cooling module 100 with a heat receiving unit 2, 2B in the form of a base plate 2B receiving a plurality of panels 11 forming a panel stack 111, where each panel 11 includes an inlet 1133 for filling of a coolant prior to operation.

Figure 16:
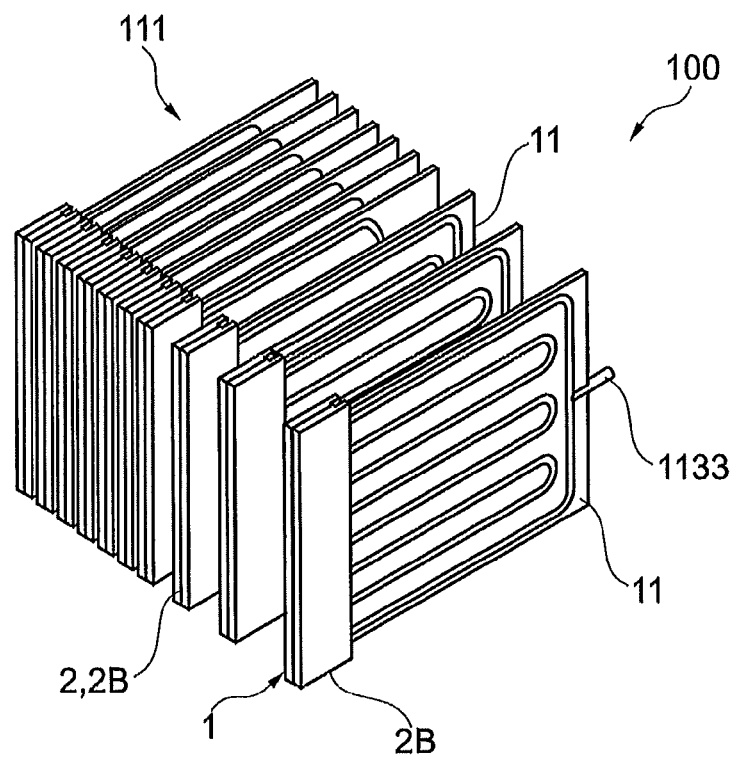
FIG. 16 schematically shows a perspective view of a cooling module with a plurality of condensers forming a panel stack with base plates according to an exemplary embodiment of the present disclosure.

FIG. 16 schematically shows the cooling module 100 of FIG. 15 in a state, where each panel 11 with a base plate 2B is stacked to a panel stack 111 or a condenser stack 111.

Figure 17:
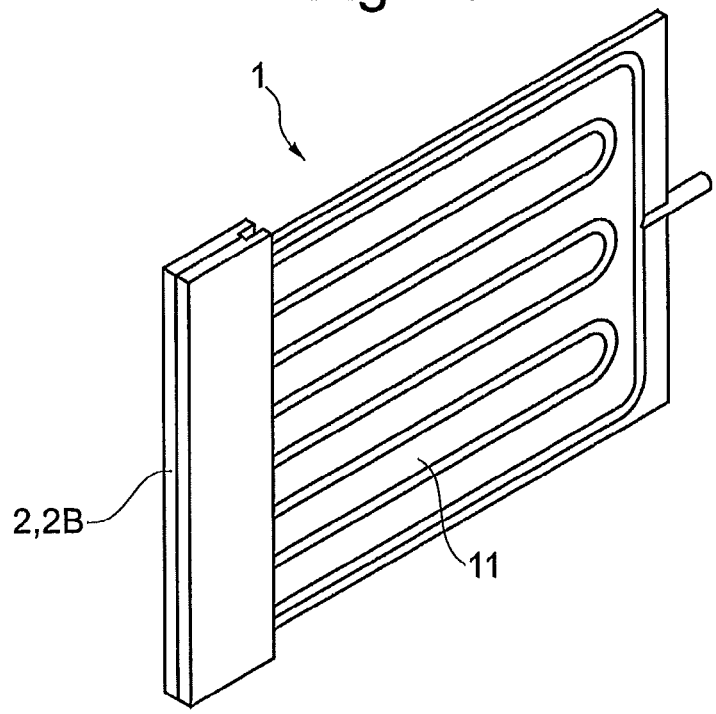
FIG. 17 schematically shows a perspective view of one panel with a base plate of FIG. 16.

FIG. 17 schematically shows one condenser 1 of FIG. 16 including a heat receiving unit 2,2B in the form of a base plate 2B receiving one panel 11.

Figure 18:
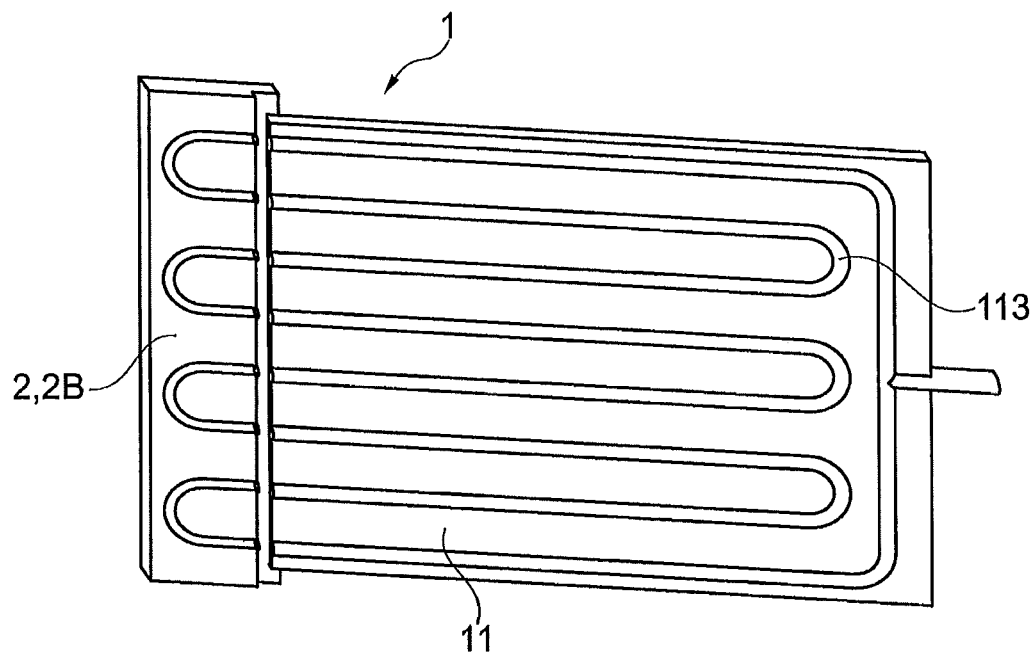
FIG. 18 schematically shows a side view of a panel of the condenser before being attached to a base plate of a cooling module according to an exemplary embodiment of the present disclosure.

FIG. 18 schematically shows a perspective view of the condenser 1 of FIG. 17, wherein the panel 11 with the conduit 113 is in a state before being connected to the heat receiving unit 2, 2B in the form of the base plate 2B.

Figure 19:
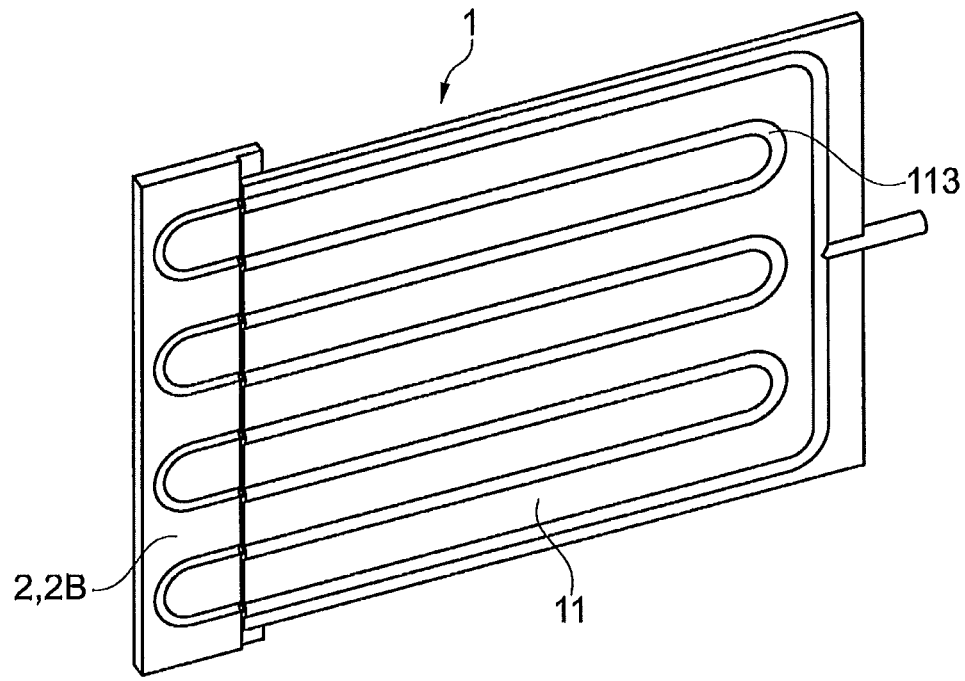
FIG. 19 schematically shows a panel attached to a base plate of a cooling module according to an exemplary embodiment of the present disclosure.

FIG. 19 schematically shows a perspective view of the condenser 1 of FIG. 18, wherein the panel 11 with the conduit 113 is attached to the heat receiving unit 2, 2B in the form of the base plate 2B.

Figure 20:
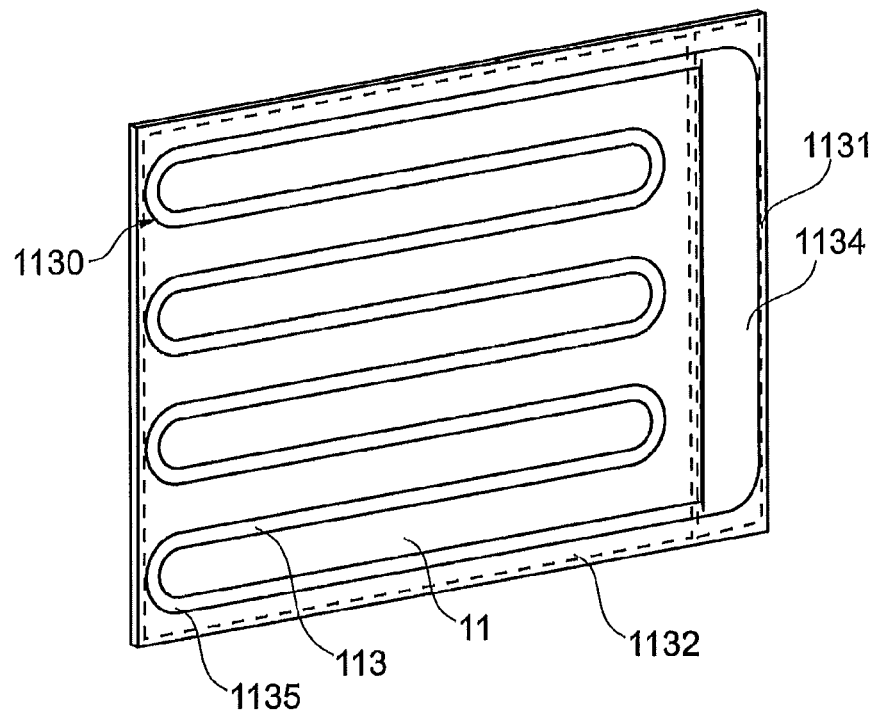
FIG. 20 schematically shows a perspective view of a panel of a cooling module indicating an evaporating section and a condensing section according to an exemplary embodiment of the present disclosure.

FIG. 20 schematically shows a perspective view of a panel 11 of a cooling module with a conduit 113, wherein an evaporating section 1131 and a condensing section 1132 is indicated.

A coolant is present in the conduit 113 for transferring heat, wherein the heat is transferred by evaporating a first portion 1134 of the coolant in the evaporating section 1131, and by condensing a second portion 1135 of the coolant at the condensing section 1132.

Figure 21:
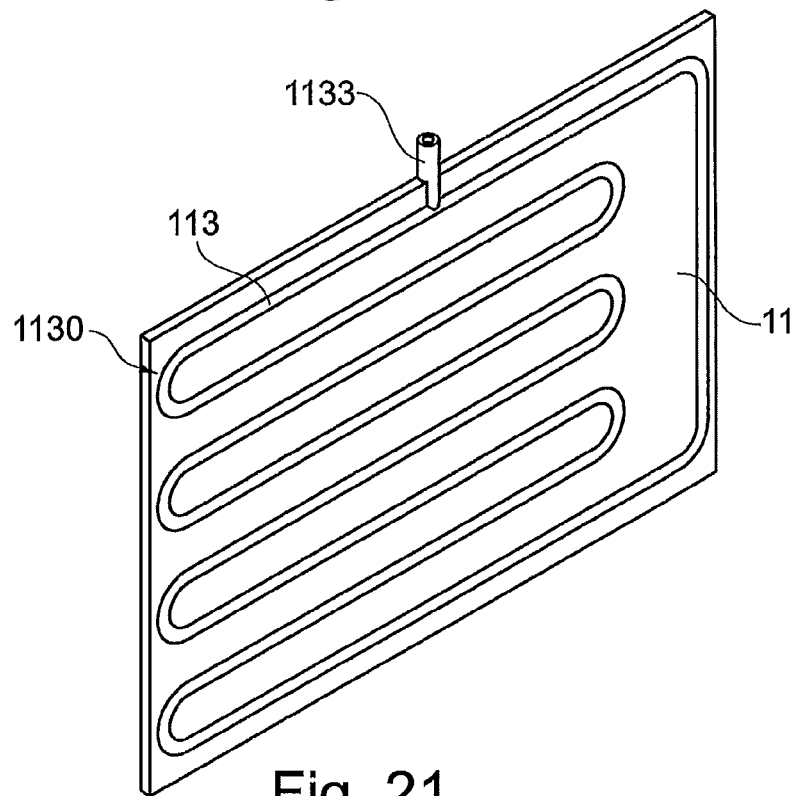
FIG. 21 schematically shows a perspective view of one panel of a cooling module according to an exemplary embodiment of the present disclosure.

FIG. 21 schematically shows a perspective view of a panel 11 of the cooling module with an inlet 1133 for filling a coolant to the conduit 113 with a plurality of loops 1130 prior to operation.

Figures 22, 23:
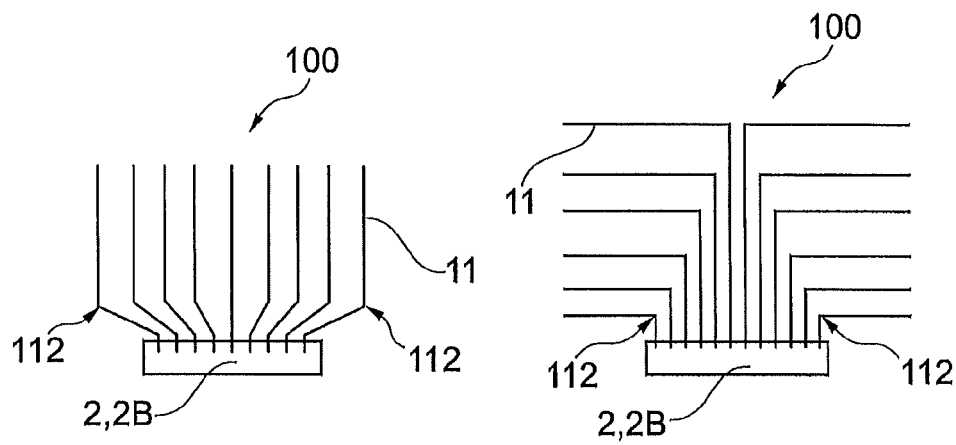
FIG. 22 schematically shows a cross-sectional view of a cooling module with a base plate and a plurality of panels according to an exemplary embodiment of the present disclosure.
FIG. 23 schematically shows a cross-sectional view of a cooling module with a base plate and a plurality of panels according to an exemplary embodiment of the present disclosure.

FIG. 22 schematically shows a cross-section of a cooling module 100 with a heat receiving unit 2, 2B in the form of a base plate 2B receiving roll-bonded panels 11 of a condenser, wherein a pair of four panels 11 with bendings 112 are symmetrically arranged next to one straight panel 11 at the base plate 2B. Panels 11 with bendings 112 may be used to enlarge the width of the plurality of panels 11 compared to the base plate 2B. A large fin surface and flow cross-sectional area may be provided while keeping the size of the base plate 2B to be small as is needed for high power density according to the embodiment of FIG. 22. The bendings 112 of FIGS. 22 and 23 may be rounded, for example.

The panels 11 with bendings 112 have two rounded edges. The panels 11 may have a plurality of rounded edges.

FIG. 23 schematically shows a cross-sectional view of the cooling module 100 of FIG. 22, wherein a pair of six panels 11 with bendings 112 are arranged symmetrically at the base plate 2B.

Figures 24, 25:
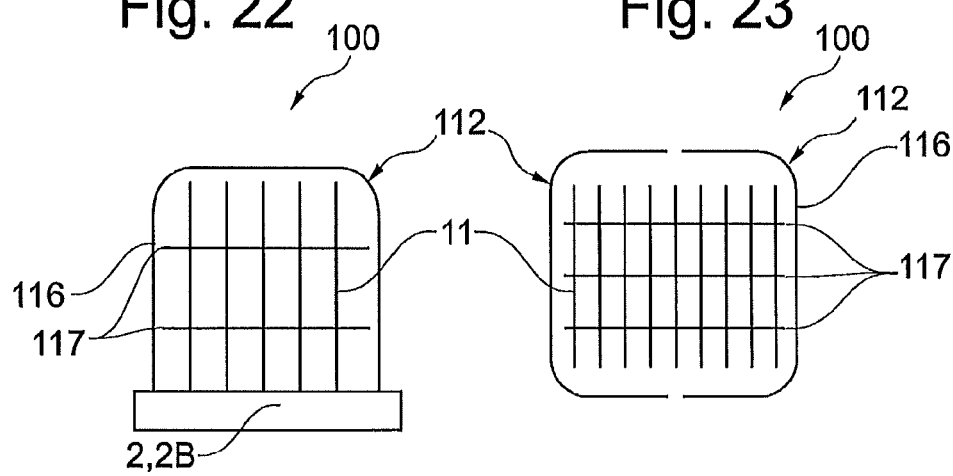
FIG. 24 schematically shows a cross-sectional view of a cooling module with a base plate and a plurality of panels according to an exemplary embodiment of the present disclosure.
FIG. 25 schematically shows a cross-sectional view of a cooling module with a base plate and a plurality of panels according to an exemplary embodiment of the present disclosure.

FIG. 24 schematically shows a cross-sectional view of a heat receiving unit 2, 2B in the form of a base plate 2B receiving panels 11 of a condenser forming a cooling module 100, wherein one cover panel 116 or cover unit 116 is covering the plurality of panels 11. The cover panel 116 has two bendings 112, such that small sides of the conduits of the panels 11 distant to the base plate 2B may be made thermally active, thus gaining thermal performance. The cover unit 116 may also not be a panel. The internal sub-channels 117 arranged traverse to the panels 11 for enabling a more efficient air flow may be optional. The sub-channels 117 may be formed by plastic or metallic plates possibly in a direction perpendicular to the plane of the panels 11. The sub-channels 117 may guide the air flow and may enable higher velocities for a defined flow rate and may provide the possibility of having streams of air in opposite directions.

FIG. 25 schematically shows a top view of the cooling module 100 of FIG. 24.

Figure 26:
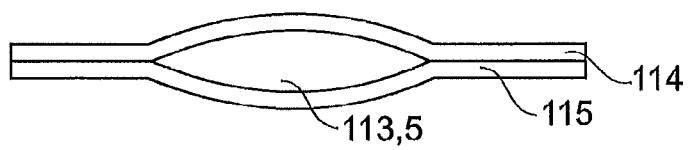
FIG. 26 schematically shows an enlarged view of a cross-section of two sheets of a panel of a cooling module according to an exemplary embodiment of the present disclosure.

FIG. 26 schematically shows two sheets 114, 115 of a panel of a condenser of a cooling module according to an exemplary embodiment of the present disclosure, where the two sheets are attached to one another by a process involving roll-bonding such that the conduit 113 is formed between the two sheets 114, 115 extending in a direction of a plane formed by the sheets 114, 115. A coolant 5 is present in the conduit 113 for transferring heat. The first sheet 114 and the second sheet 115 is bent forming the conduit 113.

Figure 27:
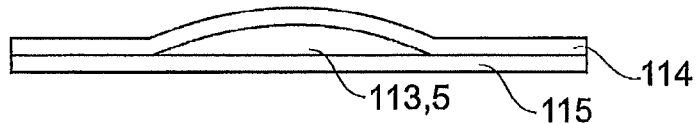
FIG. 27 schematically shows an enlarged view of a cross-section of two sheets of a panel of a cooling module according to an exemplary embodiment of the present disclosure.

FIG. 27 schematically shows a cross-sectional view of the two sheets 114 and 115 according to FIG. 26, wherein only the first sheet 114 is bent, forming the conduit 113 wherein a coolant 5 is present.

Figure 28:
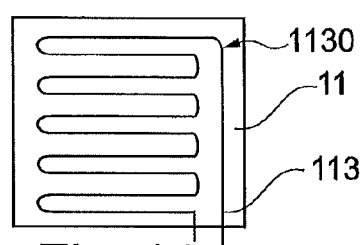
FIG. 28 schematically shows a cross-sectional view of a panel of a cooling module according to an exemplary embodiment of the present disclosure.
Figure 29:
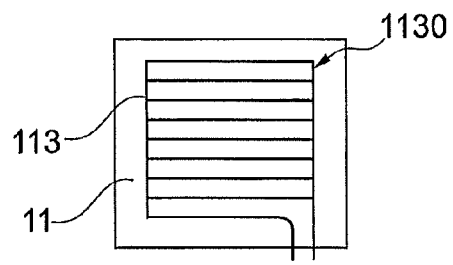
FIG. 29 schematically shows a cross-sectional view of a panel of a cooling module according to an exemplary embodiment of the present disclosure.
Figure 30:
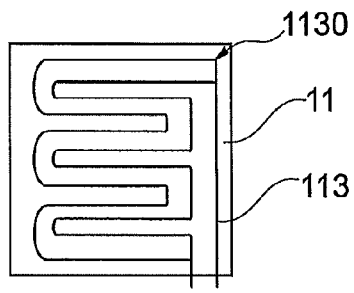
FIG. 30 schematically shows a cross-sectional view of a panel of a cooling module according to an exemplary embodiment of the present disclosure.

FIG. 28 schematically shows a cross-sectional view of a panel 11 with a conduit 113 including several loops 1130. The edges at the loop 1130 are rounded edges. Different numbers of parallel conduits 113 or channels 113 may be possible as shown in FIGS. 28 to 30. In FIG. 28 one conduit 113 or channel 113 is depicted.

FIG. 29 schematically shows a cross-sectional view of a panel 11 with a conduit 113 with loops 1130, wherein the edges are rounded edges. In FIG. 29, a plurality of parallel conduits 113 or channels 113 are depicted.

FIG. 30 schematically shows a cross-sectional view of a panel 11 wherein the conduit 113 includes loops 1130 which have edges that are rounded edges. FIG. 30 depicts two parallel conduits 113 or channels 113

Figure 31:
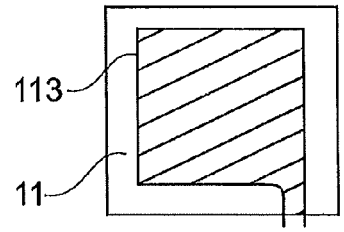
FIG. 31 schematically shows a cross-sectional view of a panel of a cooling module according to an exemplary embodiment of the present disclosure.

FIG. 31 schematically shows a cross-sectional view of a panel 11 with a conduit 113 which includes slightly tilted channels 113 or conduits 113 to assist the flow by gravity. Any geometrical form of the conduit 113 that may assist the flow by gravity may be chosen.

Figure 32:
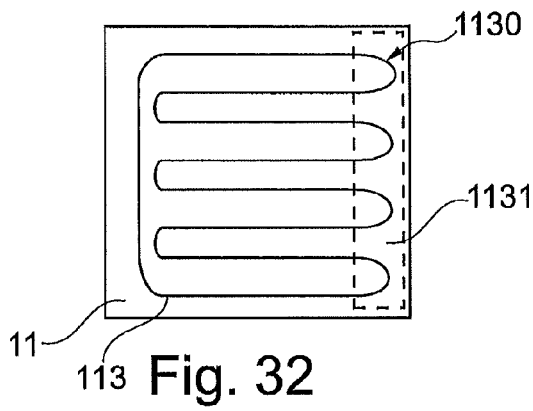
FIG. 32 schematically shows a panel with a closed conduit and an indicated evaporating section of a cooling module for pulsating cooling according to an exemplary embodiment of the present disclosure.

FIG. 32 schematically shows a cross-sectional view of a panel 11 with a conduit 113 allowing for a pulsating thermosyphon operation. In an evaporating section 1131 a coolant present in the conduit 113 is heated, respectively evaporated, causing the coolant to move in a direction away from the evaporating section 1131.

Figure 33:
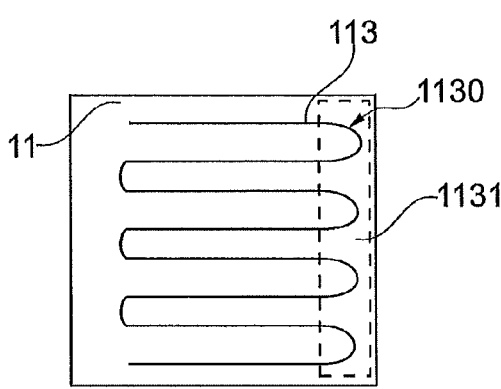
FIG. 33 schematically shows a panel with an open conduit and an indicated evaporating section of a cooling module for pulsating cooling according to an exemplary embodiment of the present disclosure.

In such a pulsating thermosyphon 11, unstable, pulsating flow of a two-phase coolant occurs in the conduit 113, for example, in the form of a slug flow, leading to a very efficient heat transfer. This pulsating flow is stimulated by the geometry of FIG. 32. The meandering conduit 113 is in contact with a heat source at 180° bendings 1130 of the conduit 113. The meandering conduit 113 can be either closed as depicted in FIG. 32 or open as schematically shown in FIG. 33. The 180° bendings 1130 do not have to be exact semi-circles as sketched in FIGS. 32 and 33.

Figure 34:
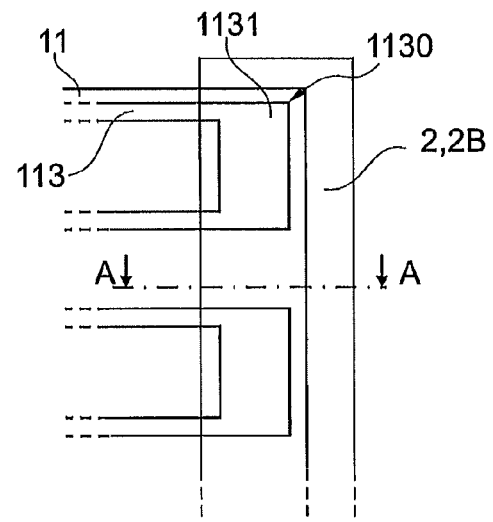
FIG. 34 schematically shows an enlarged view of a cross-section of an evaporating section of a panel of a cooling module according to an exemplary embodiment of the present disclosure.

FIG. 34 schematically shows an enlarged view of a part of the panel 11 at the evaporating section 1131 of FIG. 32 or FIG. 33 with a heat receiving unit 2, 2B in the form of a base plate 2B. Nearly rectangular bendings 1130 of the conduit 113 may maximize the contact area with the base plate 2B both for the sake of small thermal resistance to the base plate 2B and good mechanical stability of the fin 11 in a base plate groove 20 (shown in FIG. 35) of the base plate 2B. A tight contact between panels 11 or fins 11 and base plate 2B may be established by inflating the channels 113 upon inserting them in the base plate grooves 20. The base plate 2B may still be of a prismatic shape, and may be made from extruded aluminum.

Figure 35:
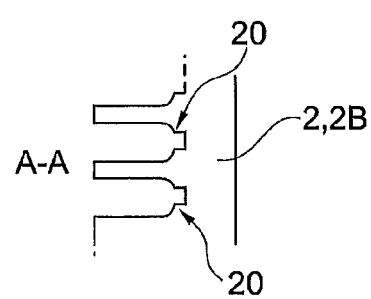
FIG. 35 schematically shows a part of a cross-section A-A of the base plate of FIG. 34 according to an exemplary embodiment of the present disclosure.

FIG. 35 shows a cross-sectional top view according to the cross-section A-A shown in FIG. 34 depicting grooves 20 of the heat receiving unit 2, 2B which is a base plate 2B.

As described above, FIG. 33 schematically shows a side view of a panel 11 with an open conduit 113 for pulsating cooling enabling a pulsating motion in an operating state of the cooling module.

Figure 36:
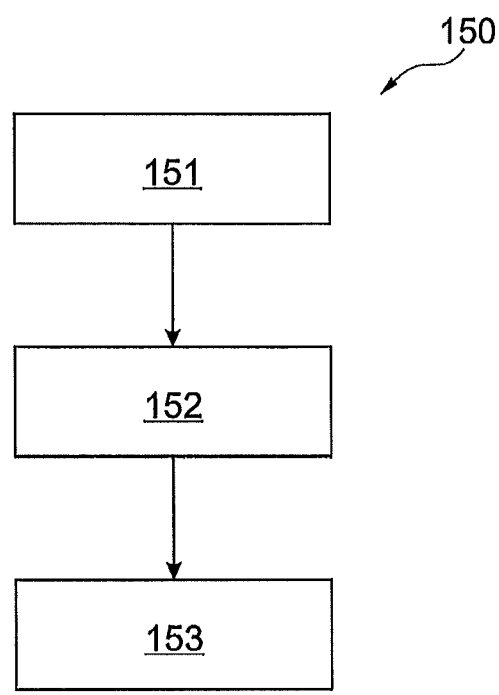
FIG. 36 schematically shows a flowchart of a method of cooling electric and/or electronic components according to an exemplary embodiment of the present disclosure.

FIG. 36 schematically shows a flowchart of a method 150 of cooling electric and/or electronic components, with the steps of: receiving heat from at least one electric and/or electronic component thermally connected to a heat receiving unit of a cooling module by the heat receiving unit in an operating state of the cooling module 151; transferring heat from the heat receiving unit to a condenser of the cooling module including a panel having two sheets that are attached to one another by a process involving roll-bonding such that a conduit is formed between the two sheets extending in a direction of a plane formed by the sheets in an operating state of the cooling module 152; and transferring the heat from the condenser to the ambient by evaporating a first portion of a coolant in the conduit, by condensing a second portion of the coolant in the conduit, and by transferring the heat from the conduit to a thermal carrier 153. The at least one conduit may be formed such that coolant motion is provided by gravity in an operating state of the cooling module according to one embodiment of the disclosure.

The at least one conduit may be formed, such that coolant motion may be provided by pulsating cooling in an operating state of the cooling module according to another embodiment of the disclosure.

While the present disclosure has been illustrated and described in detail in the drawings and the foregoing description, such illustration and description are to be considered illustrative or exemplary and not restricted; the disclosure is not limited to the disclosed embodiments.

Other variations of the disclosed embodiments may be understood and effected by those skilled in the art and practising the claimed disclosure, from a study of the drawings, the disclosure, and the appended claims.

In the claims, the word "comprising" does not exclude other elements or steps, and the indefinite article "a" or "an" does not exclude a plurality. A single cooling module or a single power module may fulfill the function of several items recited in the claims. The mere fact that certain measures are recited in mutually different dependent claims does not indicate that a combination of these measures may not be used to advantage. Any reference signs in the claims should not be construed as limiting the scope.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE SIGNS

1 Condenser, condensers
2 Heat receiving unit
2a Evaporator
2b Base plate
3 Heat source, electronic device, electronic component(s), electric component(s), IGBT(s), high voltage electronic component, power electronic device
4,4a,4b,4c,4d Cooling air, cooling agent
5 Coolant, two-phase coolant
11 Panel(s), fin(s), condenser panel
12 Condensate conduit(s)
20 Base plate groove, groove(s)
21 Vapour conduit(s)
100 Cooling module
111 Panel array, panel stack, condenser stack
112 Bendings, bendings of panels, bending of panel
113 Conduit, channel, meandering conduit(s)
114 First sheet, first metal sheet, sheet
115 Second sheet, second metal sheet, sheet
117 internal sub-channel(s), sub-channel(s)
121 Condensate header, liquid collector, condensate filling inlet
122 Condensate pipe
211 Vapour header, vapour collector
212 Vapour pipe
1130 Loop(s), bending(s), 180° bending(s), rectangular bending(s)
1131 Evaporating section of conduit in panel
1132 Condensation section of conduit in panel
1133 Inlet, conduit opening for coolant filling
1134 First portion (of a coolant)
1135 Second portion (of a coolant)

What is claimed is:

1. A cooling module for cooling at least one electronic and/or electric component, the cooling module comprising:
a condenser including at least two panels that are forming fins which are exposable to an airflow through the fins, each of the at least two panels having two sheets that are attached to one another by a process involving roll-bonding such that a conduit is formed between the two sheets extending in a direction of a plane formed by the sheets; and
wherein the at least two panels that are forming fins that are arranged such that a cooling air passage is formed between the fins for receiving the airflow through the fins.

2. The cooling module of claim 1,
wherein the conduit comprises at least one loop.

3. The cooling module of claim 1, comprising:
a heat receiving unit that is fluidly connected to the conduit,
wherein the heat receiving unit includes a connector for connecting at least one heat source such that a heat load is thermally transferrable to the heat receiving unit.

4. The cooling module of claim 3, comprising:
a plurality of panels that are arranged at the heat receiving unit such that a panel stack is formed,
wherein the heat receiving unit is connected to at least one conduit of each panel.

5. The cooling module of claim 3,
wherein the heat receiving unit is a thermally conductive base plate.

6. The cooling module of claim 3,
wherein the heat receiving unit is an evaporator.

7. The cooling module of claim 1, comprising:
a coolant being present in the conduit for transferring heat;
wherein the heat is transferable by evaporating a first portion of the coolant and by condensing a second portion of the coolant.

8. The cooling module of claim 7,
wherein a first percentage of the coolant is liquid and a second percentage of the coolant is gaseous such that the coolant is in a saturated condition filling the conduit.

9. The cooling module of claim 7,
wherein at least one conduit is formed such that a coolant motion is provided by gravity or pulsation cooling in an operating state of the cooling module.

10. The cooling module of claim 1, comprising:
a thermal carrier configured to transfer heat from the condenser to an ambient environment in an operating state of the cooling module.

11. A power module comprising:
a heat receiving unit;
at least one electric and/or electronic component thermally connected to the heat receiving unit; and
a cooling module of claim 1 with a coolant for receiving heat from the heat receiving unit and for transferring the heat to an ambient environment by a thermal carrier in an operating state of the cooling module.

12. A method of cooling electric and/or electronic components, the method comprising:
receiving heat from at least one electric and/or electronic component thermally connected to a heat receiving unit of a cooling module by the heat receiving unit in an operating state of the cooling module;
transferring heat in an operating state of the cooling module from the heat receiving unit to a condenser of the cooling module, the condenser having at least two panels that are forming fins which are exposable to an airflow through the fins, each of the at least two panels including a panel having two sheets that are attached to one another by a process involving roll-bonding such that a conduit is formed between the two sheets extending in a direction of a plane formed by the sheets; and wherein the at least two panels that are forming fins that are arranged such that a cooling air passage is formed between the fins for receiving the airflow through the fins.

13. The method of claim 12, comprising:

transferring the heat from the condenser to an ambient environment by evaporating a first portion of a coolant in the conduit, by condensing a second portion of the coolant in the conduit, and by transferring the heat from the conduit to a thermal carrier;

wherein at least one conduit is formed such that coolant motion is provided by gravity in an operating state of the cooling module.

14. The method of claim 12, comprising:

transferring the heat from the condenser to an ambient by evaporating a first portion of a coolant in the conduit, by condensing a second portion of the coolant in the conduit and by transferring the heat from the conduit to a thermal carrier;

wherein at least one conduit is formed such that coolant motion is provided by pulsating cooling in an operating state of the cooling module.

15. The method of claim 12, comprising:

a heat receiving unit that is fluidly connected to the conduit, wherein the heat receiving unit includes a connector for connecting at least one heat source such that a heat load is thermally transferrable to the heat receiving unit.

16. The method of claim 15, comprising:

a plurality of panels that are arranged at the heat receiving unit such that a panel stack is formed, wherein the heat receiving unit is connected to at least one conduit of each panel.

17. The method of claim 16, wherein the heat receiving unit is a thermally conductive base plate.

18. The method of claim 16, wherein the heat receiving unit is an evaporator.

19. The method of claim 16, comprising:

a coolant being present in the conduit for transferring heat;

wherein the heat is transferable by evaporating a first portion of the coolant and by condensing a second portion of the coolant.

20. The method of claim 19, wherein a first percentage of the coolant is liquid and a second percentage of the coolant is gaseous such that the coolant is in a saturated condition filling the conduit.

21. The method of claim 20, wherein at least one conduit is formed such that a coolant motion is provided by gravity or pulsation cooling in an operating state of the cooling module.

22. The method of claim 16, comprising:

a thermal carrier configured to transfer heat from the condenser to an ambient environment in an operating state of the cooling module.

23. A power module comprising:

a heat receiving unit;

at least one electric and/or electronic component thermally connected to the heat receiving unit; and a cooling module of claim 1 with a coolant for receiving heat from the heat receiving unit and for transferring the heat to an ambient environment by a thermal carrier in an operating state of the cooling module.

* * * * *